(12) United States Patent
Lee et al.

(10) Patent No.: US 7,297,466 B2
(45) Date of Patent: Nov. 20, 2007

(54) METHOD OF FORMING A PHOTORESIST PATTERN AND METHOD FOR PATTERNING A LAYER USING A PHOTORESIST

(75) Inventors: Sung-ho Lee, Kyungki-do (KR); Sang-gyun Woo, Yongin (KR); Yun-sook Chae, Gwacheon (KR); Ji-soo Kim, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 450 days.

(21) Appl. No.: 10/375,102

(22) Filed: Feb. 28, 2003

(65) Prior Publication Data

US 2004/0033445 A1    Feb. 19, 2004

(30) Foreign Application Priority Data

Aug. 14, 2002   (KR) .................. 10-2002-0048129

(51) Int. Cl.
*G03F 7/30*   (2006.01)
*G03F 7/004*   (2006.01)

(52) U.S. Cl. .............. 430/291; 430/311; 430/313; 430/317; 430/270.1; 430/907

(58) Field of Classification Search ........... 430/291, 430/313, 270.1, 328, 905, 910, 311, 317, 430/907
See application file for complete search history.

(56) References Cited

U.S. PATENT DOCUMENTS 4,751,170 A * 6/1988 Mimura et al. ............ 430/296
5,234,793 A   8/1993 Sebald et al.
5,286,607 A * 2/1994 Brown ........................ 430/313
5,707,783 A * 1/1998 Stauffer et al. ............. 430/313
6,210,856 B1 * 4/2001 Lin et al. .................. 430/270.1
6,432,608 B1 * 8/2002 Fujie et al. ............... 430/270.1
6,451,512 B1 * 9/2002 Rangarajan et al. ........ 430/313

FOREIGN PATENT DOCUMENTS

| JP | 6-20943 | 1/1994 |
|---|---|---|
| KR | 1998-048148 | 9/1998 |

OTHER PUBLICATIONS

Sung-Ho Lee et al., "Novel Surface silylation Process for Chemically Amplified Photoresist." SPIE's 27th Annual International Symposium and Education Program on Microlithography. Mar. 3-8, 2002. Santa Clara. California.

* cited by examiner

*Primary Examiner*—John S. Chu
(74) *Attorney, Agent, or Firm*—Volentine & Whitt, PLLC

(57) ABSTRACT

An organic anti-reflective coating (ARC) is formed over a surface of a semiconductor substrate, and a resist layer including a photosensitive polymer is formed on the ARC. The photoresistive polymer contains a hydroxy group. The resist layer is then subjected to exposure and development to form a resist pattern. The resist pattern to then silylated to a given depth by exposing a surface of the resist pattern to a vapor phase organic silane mixture of a first organic silane compound having a functional group capable of reacting with the hydroxy group of the photoresistive polymer, and a second organic silane compound having two functional groups capable of reacting with the hydroxy group of the photoresistive polymer Then, the silylated resist pattern is thermally treated, and the organic ARC is an isotropically etched using the thermally treated resist pattern as an etching mask.

2 Claims, 5 Drawing Sheets

METHOD OF FORMING A PHOTORESIST PATTERN AND METHOD FOR PATTERNING A LAYER USING A PHOTORESIST

BACKGROUND OF THE INVENTION

1. Field of the Invention

The present invention generally relates to lithography processes employed in semiconductor device fabrication and, more particularly, the present invention relates to the formation of a patterned photoresist, and to a method of a patterning a surface layer of a semiconductor substrate using a patterned photoresist.

A claim of priority is made to Korean Patent Application No. 2002-0048129, filed Aug. 14, 2002, the contents of which are incorporated herein by reference in their entirety.

2. Description of the Related Art

As the integration density of semiconductor devices continues to increase and as chip sizes continue to decrease, there is an increasing need to form patterns with finer and finer dimensions. However, as the patterned dimensions in lateral directions are reduced as necessary to form fine patterns, it is also necessary to reduce the thickness of the photoresist layer in order to avoid the collapse of the resist pattern during a wet development process of lithography. This reduction in thickness of the resist layer undesirably deteriorates resistance to dry etching, and serious line edge roughness (LER) is often observed.

In an effort to overcome the poor resistance to dry etching, a method has been proposed for reducing the overall thickness of a silicon-containing resist layer using a bi-layer resist (BLR) structure. However, according to the BLR technique, adhesion to underlying layer materials is weak and solubility to a developer solution is relatively poor, making it difficult to achieve a high resolution.

U.S. Pat. No. 5,234,793 discloses a BLR technique which includes coating a liquid, silicon-containing compound on a resist pattern subjected to exposure and development. As a result, the dry etching resistance of the resist pattern is improved, and a pattern size can be reduced in the case of forming a hole pattern, e.g., trench or contact hole. However, this technique still has several limitations. That is, it is quite difficult to adjust a CD bias due to a difference in the amount of silicon-containing compound coated according to various pattern sizes and shapes. Also, this technique can only be applied when using a resist material which includes an anhydride group, but is not suitably used with KrF or ArF resist materials, which are commercially available at present. Further, coating a liquid compound on a resist pattern is disadvantageous in that it increases costs and extends production times.

SUMMARY OF THE INVENTION

The present invention provides a method for forming a resist, and a method of patterning a layer using the resist pattern. The resist exhibits an improved line edge roughness and good resistance to dry etching even when reduced in thickness, and the methods can be adopted for various kinds of resist materials.

According to an aspect of the present invention, there is provided a method for patterning a layer of a semiconductor device. An organic anti-reflective coating is formed over a surface of a semiconductor substrate, and then a resist layer is formed over the anti-reflective coating. The resist layer includes a photosensitive polymer containing a hydroxy group. The resist layer is then subjected to selective exposure and development to form a resist pattern. The resist pattern is silylated to a given depth by exposing a surface of the resist pattern to a vapor phase organic silane mixture of a first organic silane compound having a functional group capable of reacting with the hydroxy group of the photoresistive polymer, and a second organic silane compound having two functional groups capable of reacting with the hydroxy group of the photoresistive polymer. The silylated resist pattern then thermally treated, and the organic anti-reflective coating is anisotropically etched using the thermally treated resist pattern as an etching mask.

The first organic silane compound may be contained in the organic silane mixture in an amount of approximately 20 to 90 wt % based on the total weight of the organic silane mixture. Also, the second organic silane compound may be contained in the organic silane mixture in an amount of approximately 10 to 80 wt % based on the total weight of the organic silane mixture.

The first and second organic silane compounds may independently have amino, alkylamino, dialkylamino, alkoxy, alkanoyloxy and vinyloxy group as the functional group capable of reacting with a hydroxy group. Also, the first and second organic silane compounds may each include one silicon atom or two silicon atoms, preferably one silicon atom.

Examples of the first organic silane compound include trimetylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, dimethylmethoxysilane, dimethylethoxysilane, dimethylpropoxysilane, dimethylacetoxysilane, trimethylvinyloxysilane, and dimethylvinyloxysilane.

Examples of the second organic silane compound include bis(dimethylamino)dimethylsilane, bis(dimethylamino)diethylsilane, bis(dimethylamino)methylethylsilane, bis(dimethylamino)methylsilane, bis(dimethylamino)ethylsilane, methyldimethylaminoethoxysilane, methyldiethyoxysilane, dimethyldimethoxysilane, dimethyldiethoxysilane, ethyldimethoxysilane, ethyldiethoxysilane, methyltrimethoxysilane, ethyltrimethoxysilane, dimethyidivinyloxysilane, methyidivinyloxysilane, and ethyldivinyloxysilane.

The photosensitive polymer may include a p-hydroxystyrene, fluorinated alkyl alcohol or aromatic alcohol group.

For example, the photosensitive polymer may include a copolymer of a p-hydroxystyrene monomer unit and a (meth)acrylate monomer unit. In this case, the photosensitive polymer is represented by the formula:

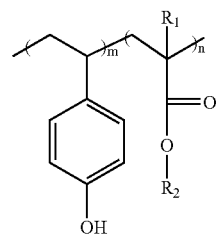

wherein $R_1$ is a hydrogen atom or a methyl group, $R_2$ is a $C_4$-$C_{20}$ hydrocarbon group, and m and n are positive integers greater than zero. Preferably, $R_2$ is t-butyl, 2-methyl-2-norbornyl, 2-methyl-2-isobornyl, 8-methyl-8-tricyclo [5.2.1.0$^{2,6}$]decanyl, 2-methyl-2-adamantyl, or 1-adamantyl-1-methylethyl.

Also, the photosensitive polymer may include a poly (p-hydroxystyrene) substituted with a protection group. In this case, the photosensitive polymer is represented by the formula:

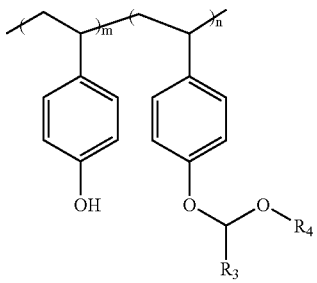

wherein $R_3$ is a hydrogen atom, a methyl, ethyl or propyl group, $R_4$ is a $C_1$ to $C_{20}$ hydrocarbon group, and m and n are positive integers greater than zero. Preferably, $R_4$ is a methyl, ethyl, propyl or methylcyclohexyl group.

Alternatively, the photosensitive polymer may include a copolymer of p-hydroxystyrene monomer unit and a (meth) acrylate monomer unit, and a poly (p-hydroxystyrene) substituted with a protection group. In this case, the photosensitive polymer is represented by the formula:

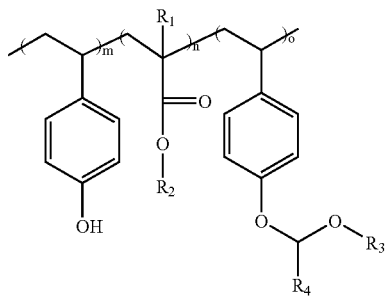

wherein $R_1$ is a hydrogen atom or a methyl group, $R_2$ is a $C_4$-$C_{20}$ hydrocarbon group $R_3$ is a hydrogen atom, a methyl, ethyl or propyl group, $R_4$ is a $C_1$ to $C_{20}$ hydrocarbon group, and m, n and o are positive integers greater than zero. $R_2$ is preferably t-butyl, 2-methyl-2-norbornyl, 2-methyl-2-isobonyl, 8-methyl -8-tricyclo[5.2.1.0$^{2,6}$]decanyl, 2-methyl-2-adamantyl, or 1-adamantyl-1-methylethyl, and $R_4$ is preferably a methyl, ethyl, propyl or methylcyclohexyl group.

Also, the photosensitive polymer may include p-hexafluoroisopropanol styrene represented by the formula:

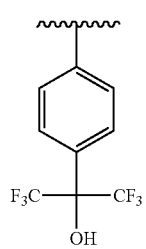

Alternatively, the photosensitive polymer may include p-hexafluoroisopropanol norbornene represented by the formula:

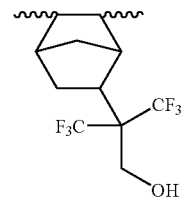

In order to adjust the given depth to which the resist pattern is silylated, a reaction temperature, a reaction time, and/or a concentration of the organic silane mixture, can be adjusted during the silylation process.

The organic silane mixture is preferably supplied at a temperature of approximately 50 to 150° C.

The silylated resist pattern is preferably thermally treated at a temperature of approximately 100 to 250° C.

According to another aspect of the present invention, there is provided a method for forming a resist pattern. The resist layer is formed over a substrate surface and includes a photosensitive polymer containing a hydroxy group. The resist layer is then subjected to selective exposure and development to form a resist pattern. The resist pattern is silylated to a given depth by exposing a surface of the resist pattern to a vapor phase organic silane mixture of a first organic silane compound having a functional group capable of reacting with the hydroxy group of the photoresistive polymer, and a second organic silane compound having two functional groups capable of reacting with the hydroxy group of the photoresistive polymer.

According to the present invention, even if it is necessary to reduce resist thickness in a lithography process, the silylated resist pattern of the present invention exhibits good resistance to dry etching. Also, the line edge roughness (LER) of the resist pattern can be improved by the flowability by the first organic silane compound.

The silylated resist pattern can be densified and a critical dimension (CD) bias caused by a volumetric increase of the silylated resist pattern can be effectively controlled by silylating and thermally heating the resist pattern.

According to the present invention, various shapes of fine patterns can be formed and various kinds of resist materials can be utilized.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF THE PREFERRED EMBODIMENTS

FIGS. 1A through 1F are cross-sectional views for explaining sequential process steps of a method for patterning a layer on a semiconductor substrate according to an embodiment of the present invention.

Figure 1A:
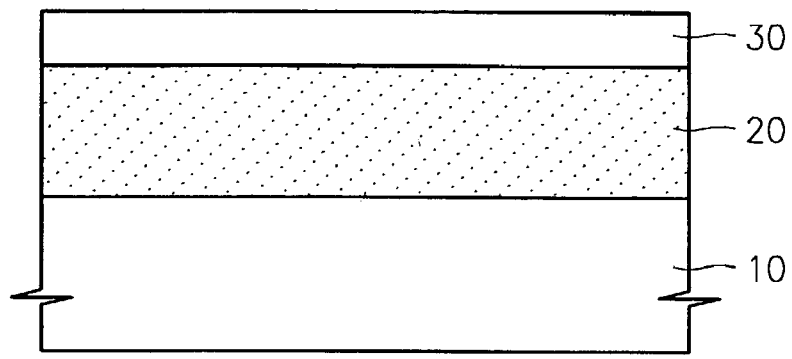
FIGS. 1A through 1F are cross-sectional views for describing sequential steps of a method for patterning a layer of a semiconductor device according to an embodiment of the present invention.

Referring to FIG. 1A, an organic anti-reflective coating (ARC) 20 is formed on a semiconductor substrate 10. The invention is not limited to any particular materials of the organic ARC 20, and conventional anti-reflective coating materials can be used. The organic ARC 20 may be formed to a thickness of approximately 0.02 to 1.0 μm.

Thereafter, a resist layer 30 is formed on the organic ARC 20, preferably to a thickness of approximately 0.1 to 1.0 μm. The resist layer 30 contains a photosensitive polymer having a hydroxy group, and can be formed of any material which is suitable for use in a photolithography process employing a desired light source, such as a KrF (248 nm) excimer laser, an ArF (193 nm) excimer laser, or a $F_2$ (157 nm) excimer laser.

Preferably, the photosensitive polymer forming the resist layer 30 includes a p-hydroxystyrene, fluorinated alkyl alcohol or an aromatic alcohol group, and is contained in an amount of approximately 40 wt % based on the total weight of the photosensitive polymer.

Representative examples of a photosensitive polymer having a p-hydroxystyrene group are described below.

A first exemplary photosensitive polymer is a coplymer of a p-hydroxystyrene monomer unit and a (meth)acrylate monomer unit, as represented by the following formula 1:

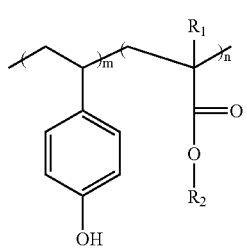

[Formula 1]

wherein $R_1$ is a hydrogen atom or a methyl group, and $R_2$ is a $C_4$-$C_{20}$ hydrocarbon group, and m and n are positive integers greater than zero. Preferably, $R_2$ is t-butyl, 2-methyl-2-norbornyl, 2-methyl-2-isobornyl, 8-methyl-8-tricyclo[5.2.1.0$^{2,6}$]decanyl, 2-methyl-2-adamantyl, or 1-adamantyl-1-methylethyl.

A second exemplary photosensitive polymer may include a poly (p-hydroxystyrene) substituted with a protection group, as represented by a formula 2:

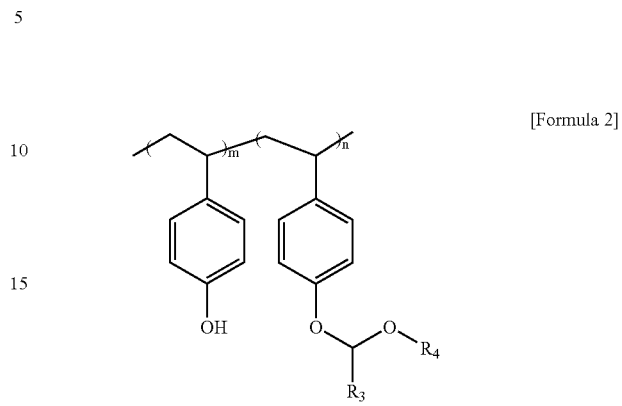

[Formula 2]

wherein $R_3$ is a hydrogen atom, a methyl, ethyl or propyl group, $R_4$ is a $C_1$ to $C_{20}$ hydrocarbon group, and m and n are positive integers greater than zero. Preferably, $R_4$ is a methyl, ethyl, propyl or methylcyclohexyl group.

A third exemplary photosensitive polymer may include a copolymer of p-hydroxystyrene monomer unit, a (meth)acrylate monomer unit, and a poly (p-hydroxystyrene) substituted with a protection group, as represented by a formula 3:

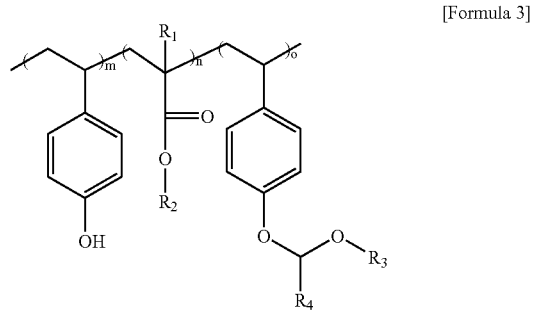

[Formula 3]

wherein $R_1$ is a hydrogen atom or a methyl group, $R_2$ is a $C_4$-$C_{20}$ hydrocarbon group $R_3$ is a hydrogen atom, a methyl, ethyl or propyl group, $R_4$ is a $C_1$ to $C_{20}$ hydrocarbon group, and m, n and o are positive integers greater than zero. $R_2$ is preferably t-butyl, 2-methyl-2-norbornyl, 2-methyl-2-isobornyl, 8-methyl -8-tricyclo[5.2.1.0$^{2,6}$]decanyl, 2-methyl-2-adamantyl, or 1-adamantyl-1-methylethyl, and $R_4$ is preferably a methyl, ethyl, propyl or methylcyclohexyl group.

Also, the photosensitive polymer forming the resist layer 30 may include p-hexafluoroisopropanol styrene as represented by formula 4:

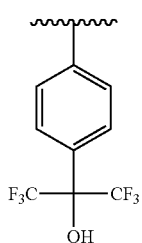

[Formula 4]

Also, the photosensitive polymer forming the resist layer 30 may include p-hexafluoroisopropanol norbornene as represented by formula 5:

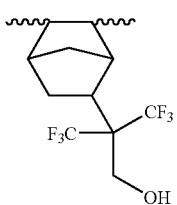

[Formula 5]

Figure 1B:
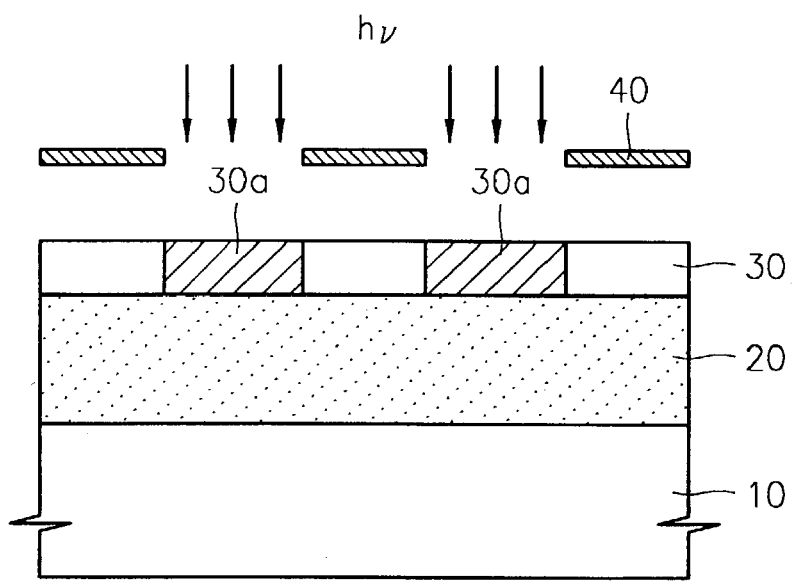

Referring to FIG. 1B, the resist layer 30 is exposed using a mask pattern 40. As a result, an exposed region 30a is formed at the resist layer 30.

Figure 1C:
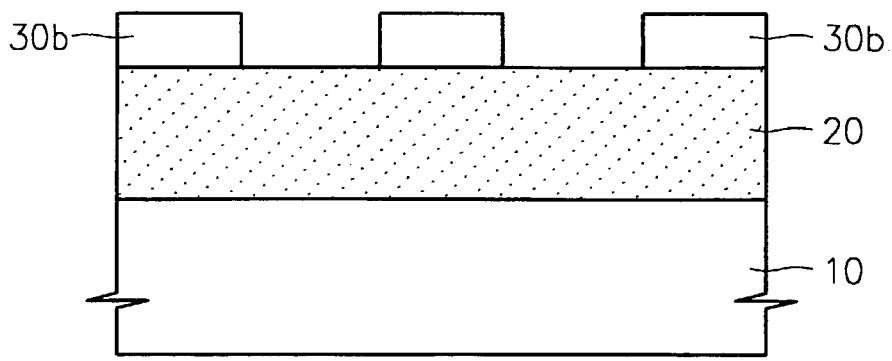

Referring to FIG. 1C, the exposed resist layer 30 is thermally treated by post-exposure baking (PEB) and developed using a 2.38 wt % TMAH aqueous solution to remove the exposed region 30a. As a result, a resist pattern 30b is formed on the organic ARC 20.

Figure 1D:
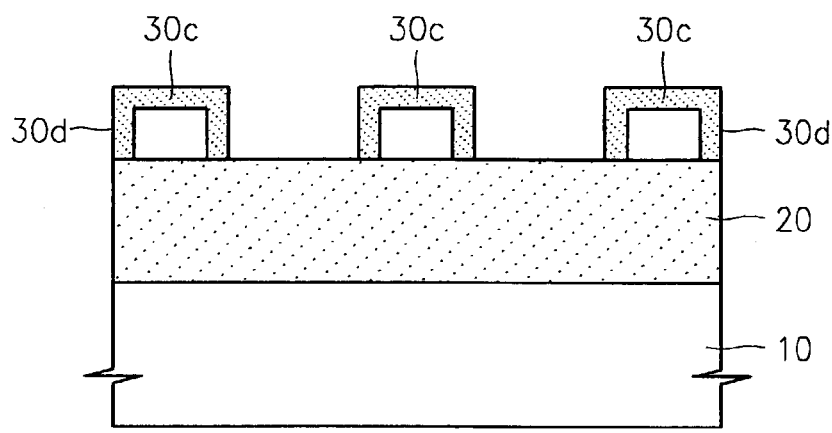

Referring to FIG. 1D, a vapor phase organic silane compound is supplied to a resultant product having the resist pattern 30b to induce a reaction between the hydroxy group in the photosensitive polymer forming the resist pattern 30b and the organic silane compound, thereby silylating the resist pattern 30b to a given depth from the exposed surfaces thereof. Here, the reaction temperature may be in the range of approximately 50 to 150° C.

The organic silane mixture includes a first organic silane compound having a functional group capable of reacting with the hydroxy group of the resist polymer, and a second organic silane compound having two functional groups capable of reacting with the hydroxy group of the resist polymer. The first organic silane compound serves to flow the resist pattern 30b by increasing the flowability thereof. The second organic silane compound serves as a crosslinker of the photosensitive polymer. Preferably, the first and second organic silane compounds independently include one silicon atom or two silicon atoms, more preferably one silicon atom.

The first and second organic silane compounds may independently contain amino, alkylamino, dialkylamino, alkoxy, alkanoyloxy and vinyloxy group as the functional group capable of reacting with a hydroxy group.

The first organic silane compound may be contained in the organic silane mixture in an amount of approximately 20 to 90 wt % based on the total weight of the organic silane mixture. Also, the second organic silane compound may be contained in the organic silane mixture in an amount of approximately 10 to 80 wt %, more preferably 10 to 30 wt %, based on the total weight of the organic silane mixture.

If only the first organic silane compound is reacted with the hydroxy group of the photosensitive polymer, a sharp decrease in glass transition temperature (Tg) may occur in the resist pattern 30b, which can cause swelling and flow of the resist pattern 30b, resulting in severe pattern deformation. If only the second organic silane compound is reacted with the hydroxy group of the photosensitive polymer, flow of the resist pattern 30b is suppressed, so that LER occurring at edges of the resist pattern 30b cannot be entirely avoided. Therefore, in order to ensure a sufficient LER improvement by flowability of the resist pattern 30b and a pattern deformation prevention by hardening by crosslinkage, it is necessary to use a mixed organic silane compound obtained by mixing the first and second organic silane compounds in an appropriate mixing ratio.

Suitable examples of the first organic silane compound include, but are not limited to, trimetylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, dimethylmethoxysilane, dimethylethoxysilane, dimethylpropoxysilane, dimethylacetoxysilane, trimethylvinyloxysilane, and dimethylvinyloxysilane.

Suitable examples of the second organic silane compound include, but are not limited to, bis(dimethylamino)dimethylsilane, bis(dimethylamino)diethylsilane, bis(dimethylamino)methylethylsilane, bis(dimethylamino)methylsilane, bis(dimethylamino)ethylsilane, methyldimethylaminoethoxysilane, methyldiethyoxysilane, dimethyldimethoxysilane, dimethyldiethoxysilane, ethyldimethoxysilane, ethyldiethoxysilane, methyltrimethoxysilane, ethyltrimethoxysilane, dimethyldivinyloxysilane, methyldivinyloxysilane, and ethyldivinyloxysilane.

As described above, the resist pattern 30b is silylated to a given depth using the vapor phase organic silane mixture by reaction between the hydroxy group of the photosensitive polymer forming the resist pattern 30b and the first and second organic silane compounds occurs. Therefore, as shown in FIG. 1D, a silylated resist pattern 30d is formed having a silylation region 30c extending to a given depth from the exposed surfaces.

The thickness of the silylation region 30c of the silylated resist pattern 30d may vary according to the shape and size of a pattern to be formed, and is generally approximately 100 to 500 Å, preferably approximately 100 to 200 Å.

When the organic silane mixture is supplied to the resist pattern 30b, the reaction temperature, the time for a reaction between the organic silane mixture and the resist pattern 30b, and/or the concentration of the organic silane mixture, can be adjusted to control the depth of the silylation region 30c.

Figure 1E:
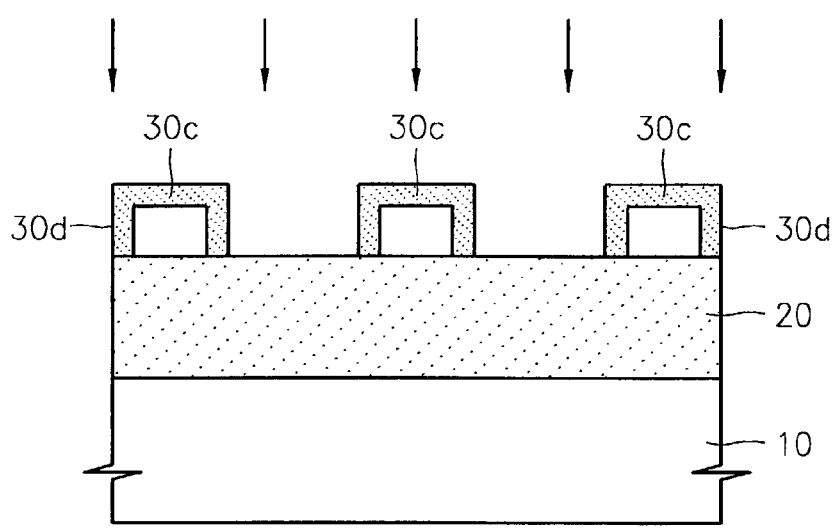

Referring to FIG. 1E, the silylated resist pattern 30d is thermally treated. The thermal treatment may be performed at a temperature of approximately 100 to 250° C., preferably approximately 150 to 200° C., for the purpose of densifying the silylated resist pattern 30d and stabilizing the bonding state between the resist composition and the organic silane compound.

The silylated resist pattern 30d may swell a little bit horizontally and vertically during the silylation process shown in FIG. 1D. However, since such a change in pattern size is very small, that is, approximately 10 nm or less, it is not necessary to separately adjust a bias. Thus, the thermal treatment advantageously reduces the increased volume of the silylated resist pattern 30d without a separate bias adjustment.

Figure 1F:
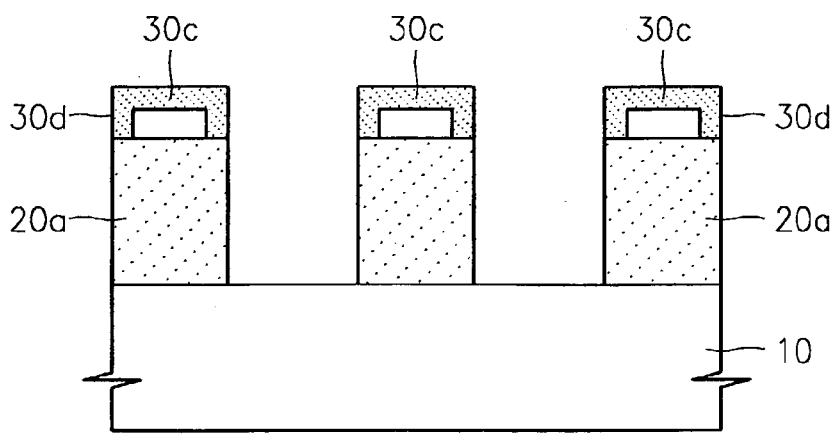

Referring to FIG. 1F, the organic ARC 20 is anisotropically etched with $O_2$ plasma using the silylated resist pattern 30d as an etching mask, thereby forming an ARC pattern 20a. The silylated resist pattern 30d has high resistance to anisotropic etching using $O_2$ plasma.

As described above, swelling of the resist pattern occurring during the silylation process shown in FIG. 1D, is due to infiltration of the silicon compound contained in the organic silane mixture into the resist pattern to then be bonded with the polymer through a reaction between the silicon compound and hydroxy groups in the polymer contained in the resist pattern.

Figure 2:
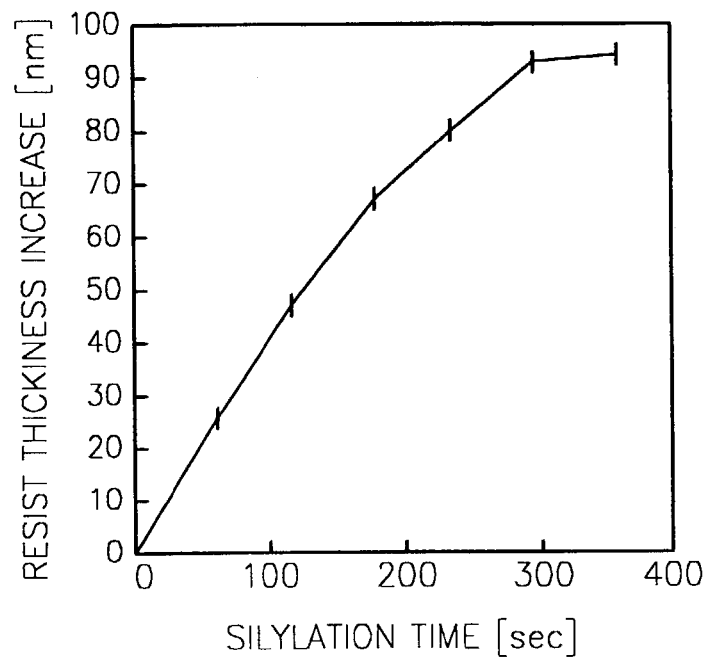
FIG. 2 is a graphical representation illustrating evaluation results of a resist pattern thickness increase relative to a silylation time of a resist pattern according to the present invention.

FIG. 2 is a graphical representation illustrating evaluation results of a resist pattern thickness increase relative to a silylation time of the resist pattern according to the present invention;

For the evaluation shown in FIG. 2, the resist pattern made of polyvinylphenol (PVP) based resist is subjected to silylation using an organic silane mixture. Here, dimethylsilyldimethylamine (DMSDMA) is used as a first organic silane compound and bis(dimethylamino)methylsilane (Bi(DMA)MS) was used as a second organic silane compound. The evaluation results shown in FIG. 2 are obtained when mixing DMSDMA and Bi(DMA)MS in a weight ratio of 65:35 and silylating a resist pattern having a line width of 200 nm.

Referring to FIG. 2, the increase in amount of thickness of a resist pattern linearly increases over silylation time, confirming that the content of Si contained in the resist pattern can be easily controlled by silylation time.

Also, a volumetric increase due to silylation of a resist pattern causes a change in critical dimension (CD).

Figure 3:
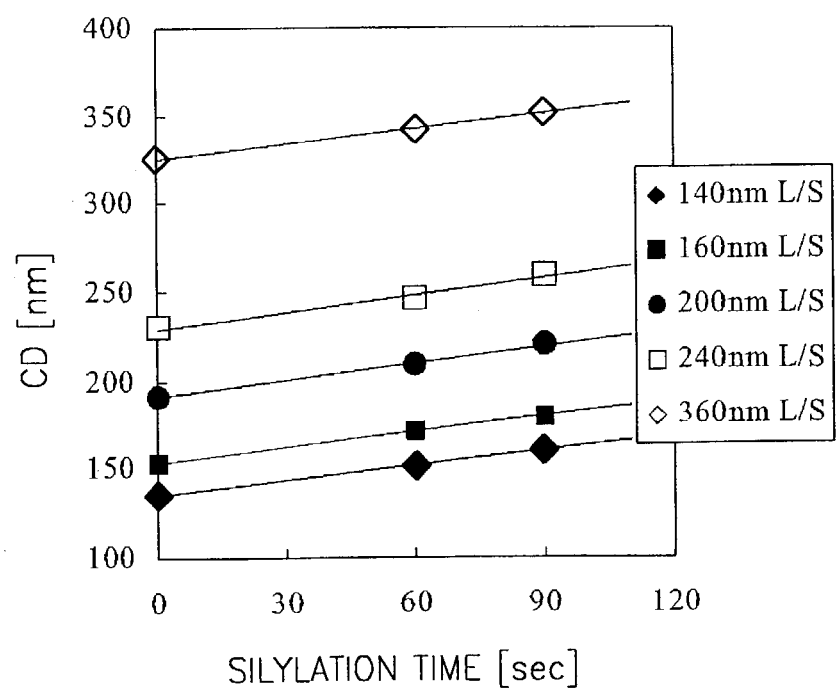
FIG. 3 is a graphical representation illustrating a change in CD as a function of silylation time of a resist pattern according to the present invention.

FIG. 3 shows a change in CD of a resist pattern as a function of the silylation time.

For the evaluation shown in FIG. 3, resist patterns and an organic silane mixture made of the same materials as those of samples used for evaluation shown in FIG. 2 were used. The respective resist patterns were formed as line and space (L/S) patterns having various line widths of 140 nm, 160 nm, 200 nm, 240 nm and 360 nm.

Referring to FIG. 3, the CD of each resist pattern linearly increases with silylation time, and increases as the size of each resist pattern increases.

Some of the organic silane compounds, in particular, DMSDMA, are very effective silylating agents, but are very unstable, so that desilylation occurs over time, resulting in a reduction of the thickness of the resist pattern.

Figure 4:
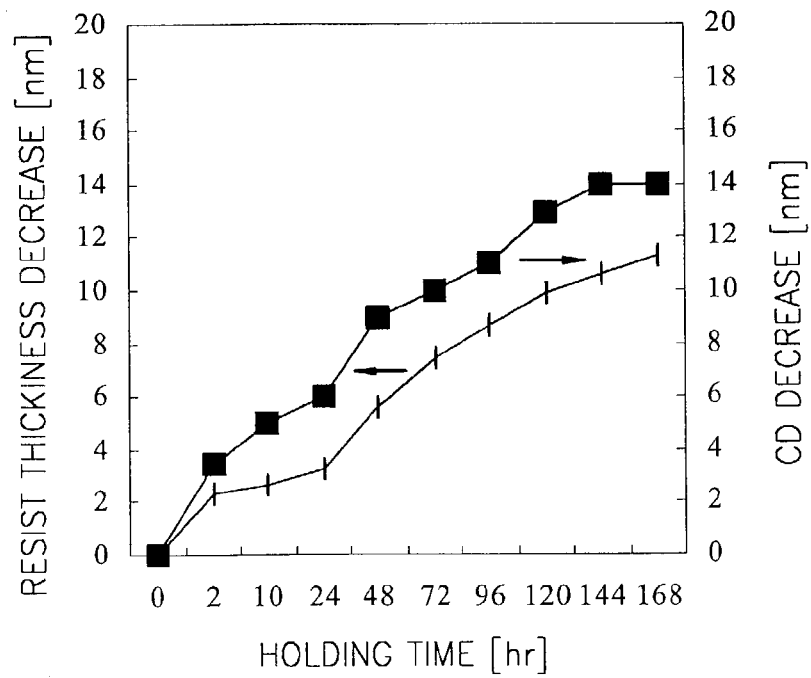
FIG. 4 is graphical representation illustrating evaluation results of a resist pattern thickness decrease and CD decrease relative to a holding time of a resist pattern silylated using an organic silane mixture according to the present invention.

FIG. 4 is graphical representation illustrating evaluation results of a resist pattern thickness decrease and CD decrease relative to a holding time of a resist pattern silylated using an organic silane mixture of DMSDMA and Bi(DMA)MS according to the present invention.

Referring to FIG. 4, the resist pattern thickness decrease is very large at an initial period of holding time, and gradually becomes saturated over time. The desilylation deteriorates resistance of the resist pattern to dry etching and reduces CD.

In the method for forming fine patterns of a semiconductor device according to the present invention, the silylation of the resist pattern is followed by thermal treatment for the purpose of solving the problem of a CD decrease resulting from desilyation. Here, in order to control contamination due to amine contained in a chemically amplified resist, the temperature for thermal treatment is preferably greater than a glass transition temperature (Tg) of a resist material of the resist pattern. Thermal treatment at a temperature greater than Tg densifies the resist pattern and thus prevents amine contaminants from infiltrating into the resist pattern.

Also, thermal treatment performed after the silylation can prevent a silicon compound from being released from the resist pattern.

Figure 5:
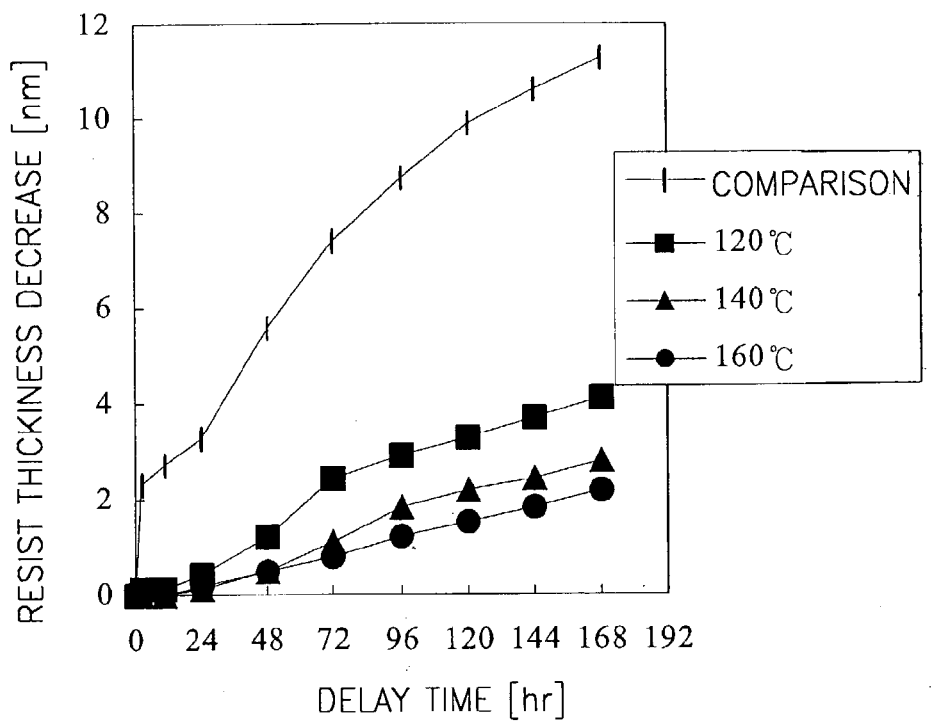
FIG. 5 is graphical representation illustrating evaluation results of a resist pattern thickness decrease and CD decrease relative to a delay time of a resist pattern when the silylated resist pattern is thermally treated according to the present invention.

FIG. 5 is graphical representation illustrating evaluation results of a resist pattern thickness decrease and CD decrease relative to a delay time of a resist pattern when the silylated resist pattern is thermally treated at various temperatures for 90 seconds according to the present invention. For comparison, evaluation results of a silylated resist pattern which is not thermally treated, are also shown in FIG. 5.

Referring to FIG. 5, a thickness decrease in the silylated resist pattern which is thermally treated at a temperature of 120 C or higher, is smaller than that in the silylated resist pattern which is not thermally treated. For example, when the resist pattern is thermally treated at 160° C., a thickness decrease of only approximately 2 nm was observed after a week of delay time. This suggests that instability of a silylating agent can be overcome by thermally treating the silylated resist pattern.

Thermal treatment performed after the silylation has another advantage in that the resist film shrinks very rapidly during thermal treatment to then be densified. Shrinkage of the resist pattern due to thermal treatment can be confirmed through observation of a change in CD.

Figure 6:
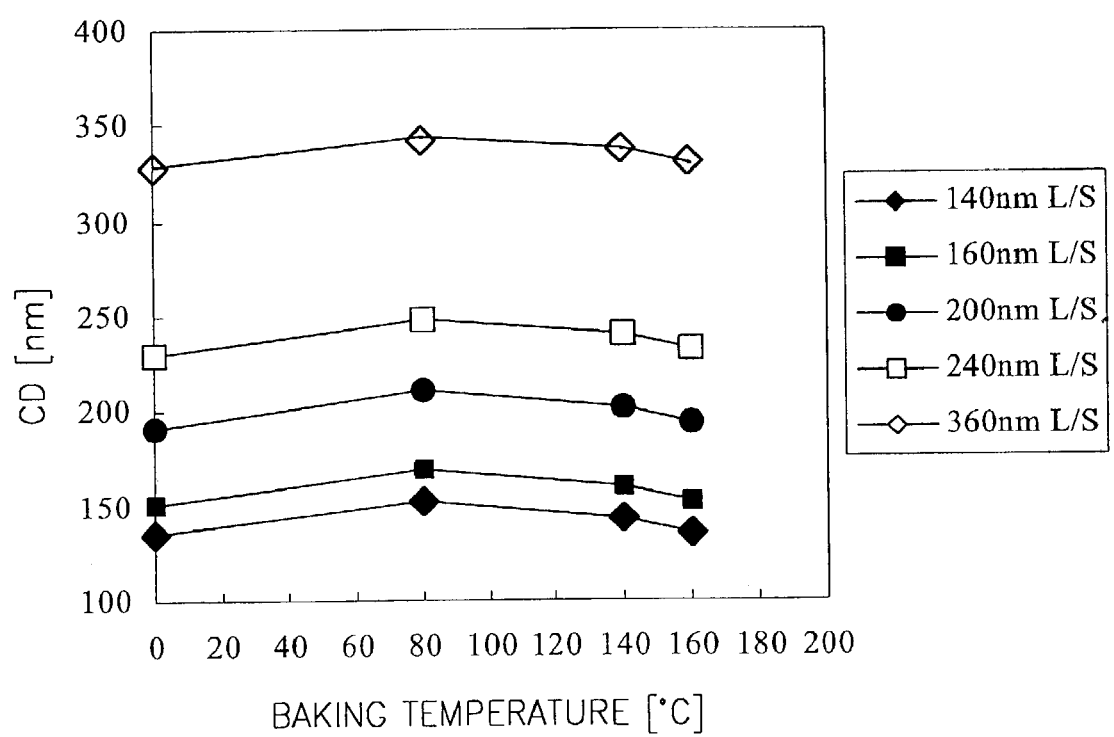
FIG. 6 is graphical representation illustrating evaluation results of a CD change of a resist pattern, when the resist pattern silyated using an organic silane mixture is thermally treated at various temperatures according to the present invention.

FIG. 6 is graphical representation illustrating evaluation results of a CD change of a resist pattern relative to baking temperature when the resist pattern silyated with an organic silane mixture of DMSDMA and Bi(DMA)MS is thermally treated by baking at various temperatures according to the present invention. For the evaluation shown in FIG. 6, the resist patterns were formed as line and space (L/S) patterns having various line widths of 140 nm, 160 nm, 200 nm, 240 nm and 360 nm, respectively.

Referring to FIG. 6, the CD of a resist pattern having increased by silylation decreases as the baking temperatures increase. Also, a CD decrease is kept constant irrespective of resist pattern size. This suggests that a CD bias due to a volumetric increase after the resist pattern is silylated can be easily controlled by subsequent thermal treatment.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for patterning a layer, comprising:
   forming an organic anti-reflective coating over a surface of a semiconductor substrate;
   forming a resist layer comprising a photosensitive polymer over the anti-reflective coating, the photosensitive polymer containing a hydroxy group;
   subjecting the resist layer to selective exposure and development to form a resist pattern;
   silylating the resist pattern to a given depth by exposing a surface of the resist pattern to a vapor phase organic silane mixture of a first organic silane compound having a functional group capable of reacting with the hydroxy group of the photoresistive polymer, and a second organic silane compound having two functional groups capable of reacting with the hydroxy group of the photoresistive polymer;

thermally treating the silylated resist pattern; and
anisotropically etching the organic anti-reflective coating using the thermally treated resist pattern as an etching mask,
wherein the photosensitive polymer includes p-hexafluoroisopropanol styrene having a formula:

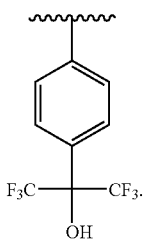

2. A method for patterning a layer, comprising:
forming an organic anti-reflective coating over a surface of a semiconductor substrate;
forming a resist layer comprising a photosensitive polymer over the anti-reflective coating, the photosensitive polymer containing a hydroxy group;
subjecting the resist layer to selective exposure and development to form a resist pattern;
silylating the resist pattern to a given depth by exposing a surface of the resist pattern to a vapor phase organic silane mixture of a first organic silane compound having a functional group capable of reacting with the hydroxy group of the photoresistive polymer, and a second organic silane compound having two functional groups capable of reacting with the hydroxy group of the photoresistive polymer;
thermally treating the silylated resist pattern; and
anisotropically etching the organic anti-reflective coating using the thermally treated resist pattern as an etching mask,
wherein the photosensitive polymer includes 2-hexafluoroisopropanol norbornene having a formula:

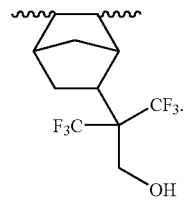

* * * * *